United States Patent
Pream et al.

(10) Patent No.: US 10,171,110 B1
(45) Date of Patent: Jan. 1, 2019

(54) SEQUENTIAL POWER TRANSITIONING OF MULTIPLE DATA DECODERS

(71) Applicant: Seagate Technology LLC, Cupertino, CA (US)

(72) Inventors: Jeffrey John Pream, Berthoud, CO (US); Eric Michael Beck, Broomfield, CO (US)

(73) Assignee: Seagate Technology LLC, Cupertino, CA (US)

( * ) Notice: Subject to any disclaimer, the term of this patent is extended or adjusted under 35 U.S.C. 154(b) by 0 days.

(21) Appl. No.: 15/640,724

(22) Filed: Jul. 3, 2017

(51) Int. Cl.
*H03M 13/37* (2006.01)
*G06F 11/10* (2006.01)
*G11C 29/52* (2006.01)
*H03M 13/11* (2006.01)
*G11C 11/4072* (2006.01)
*G11C 29/00* (2006.01)

(52) U.S. Cl.
CPC ..... *H03M 13/3723* (2013.01); *G06F 11/1068* (2013.01); *G11C 11/4072* (2013.01); *G11C 29/52* (2013.01); *G11C 29/83* (2013.01); *H03M 13/1111* (2013.01); *G11C 2207/2227* (2013.01); *G11C 2211/4067* (2013.01)

(58) Field of Classification Search
CPC .......... H03M 13/3723; H03M 13/1111; G06F 11/1068; G11C 29/52; G11C 11/4072; G11C 29/83; G11C 2207/2227; G11C 2211/4067
USPC ....... 714/764, 766, 763, 752, 768, 773, 786, 714/799, 704, 718; 365/200, 201
See application file for complete search history.

(56) References Cited

U.S. PATENT DOCUMENTS

| | | | |
|---|---|---|---|
| 7,191,378 B2 | 3/2007 | Eroz et al. |
| 7,562,279 B2 | 7/2009 | Zhang et al. |
| 7,911,364 B1 | 3/2011 | Zhang et al. |
| 7,934,139 B2 | 4/2011 | Andreev et al. |
| 8,201,051 B2 | 6/2012 | Tan et al. |
| 8,484,531 B1 | 7/2013 | Vamica et al. |

(Continued)

OTHER PUBLICATIONS

Ahmed A. Emran and Maha Elsabrouty, "Generalized Simplified Variable-Scaled Min Sum LDPC decoder for irregular LDPC Codes," Electronics and Electrical Communications, 5 pps., Egypt-Japan University for Science and Technology, Alexandria, Egypt.

(Continued)

*Primary Examiner* — John J Tabone, Jr.
(74) *Attorney, Agent, or Firm* — Hall Estill Attorneys at Law

(57) ABSTRACT

Method and apparatus for managing data decoder circuits, such as LDPC (low density parity check) decoders in a solid state drive (SSD). In some embodiments, a non-volatile memory (NVM) is configured to store data in the form of code words. Each code word has a user data payload and associated code bits. A plurality of data decoder circuits are configured to use the code bits to detect and correct bit errors in the code words during a read operation. A power transition circuit is configured to successively transition each of the data decoder circuits in turn from a first power mode to a second power mode, such as from an active mode to an idle mode, at a different time and at a conclusion of a predetermined time interval. In this way, voltage spikes or other anomalous conditions on a voltage source pathway may be reduced.

20 Claims, 4 Drawing Sheets

(56) References Cited

U.S. PATENT DOCUMENTS

| | | | |
|---|---|---|---|
| 8,543,883 B2 | 9/2013 | Chen et al. | |
| 8,566,665 B2 | 10/2013 | Li | |
| 8,650,451 B2 * | 2/2014 | Krishnan | H03M 13/6577 |
| | | | 714/746 |
| 8,656,249 B2 | 2/2014 | Chen et al. | |
| 8,709,863 B2 | 4/2014 | Varnica et al. | |
| 8,862,961 B2 | 10/2014 | Zhang et al. | |
| 8,879,640 B2 | 11/2014 | Chow et al. | |
| 8,930,788 B2 | 1/2015 | Zhang et al. | |
| 9,015,547 B2 | 4/2015 | Wang et al. | |
| 2008/0198273 A1 * | 8/2008 | Yefim | G08C 23/04 |
| | | | 348/734 |
| 2010/0117853 A1 * | 5/2010 | Vayl | H04B 10/1141 |
| | | | 340/12.53 |
| 2012/0144211 A1 * | 6/2012 | Amador | G06F 1/3228 |
| | | | 713/300 |
| 2012/0246353 A1 * | 9/2012 | Lim | G06F 13/28 |
| | | | 710/22 |
| 2014/0089757 A1 | 3/2014 | Yang et al. | |
| 2015/0205527 A1 * | 7/2015 | Cohen | G11C 29/52 |
| | | | 711/103 |
| 2015/0227186 A1 * | 8/2015 | Bhatia | G06F 1/3203 |
| | | | 713/320 |
| 2015/0372695 A1 | 12/2015 | Li et al. | |
| 2016/0285870 A1 * | 9/2016 | Poornachandran | G06F 1/3287 |
| 2017/0017296 A1 * | 1/2017 | Guddeti | G06F 1/3228 |

OTHER PUBLICATIONS

Ahmed A. Emran and Maha Elsabrouty, "Simplified Variable-Scaled Min Sum LDPC decoder for irregular LDPC Codes," Electronics and Communications Engineering Department, 6 pps., Egypt-Japan University for Science and Technology, Alexandria, Egypt.

Kiran K. Gunnam, Gwan S. Choi, Weihuang Wang and Mark B. Yeary, "A Parallel VLSI Architecture for Layered Decoding," pp. 1-54.

Ahmed A. Hamad, "Estimation of Two-Dimensional Correction Factors for Min-Sum Decoding of Regular LDPC Code," Wireless Engineering and Technology, 2013, pp. 181-187, 4, Scientific Research.

Yongmin Jung, Yunho Jung, Seongjoo Lee and Jaeseck Kim, "New Min-Sum LDPC Decoding Algorithm Using SNR-Considered Adaptive Scaling Factors," ETRI Journal, Aug. 2014, pp. 591-598, vol. 36, No. 4.

Marjan Karkooti, Predrag Radosavljevic and Joseph R. Cavallaro, "Configurable, High Throughput, Irregular LDPC Decoder Architecture: Tradeoff Analysis and Implementation," Department of Electrical and Computer Engineering, Rice University, 8 pps., Houston, Texas.

Tom Richardson, "Error Floors of LDPC Codes," pp. 1426-1435, Flarion Technologies, Bedminster, Jer Jersey.

Geo Niju Shanth and Saru Priya, "Low Complexity Implementation of LDPC Decoder Using MIN-Sum Algorithm," International Journal of Computer Applications, 2013, International Conference on Innovations in Intelligent Instrumentation, Optimization and Signal Processing, Velammal Engineering College, Chennai.

Juntan Zhang, Marc Fossorier, Daqing Gu, and Jinyun Zhang, Improved Min-Sum Decoding of LDPC Codes Using 2-Dimensional Normalization, Mitsubishi Electric Research Laboratories, Inc., Jun. 2006, 7 pps., Cambridge, Massachusetts.

Juntan Zhang, Marc Fossorier, Daqing Gu, and Jinyun Zhang, "Two-Dimensional Correction for Min-Sum Decoding of Irregular LDPC Codes," Mitsubishi Electric Research Laboratories, Inc., Jun. 2006, 4 pps., Cambridge, Massachusetts.

Zhengya Zhang, Lara Dolecek, Martin Wainwright, Venkat Anantharam and Borivoje Nikolic, "Quantization effects in Low-Density Parity-Check Decoders," IEEE, 2007, pp. 6231-6237.

Xiaojie Zhang and Paul H. Siegel, "Quantized Min-Sum Decoders with Low Error Floor for LDPC Codes," IEEE, 2012, pp. 2871-2875.

Hao Zhong, Wei Xu, Ningde Xie and Tong Zhang, "Area-Efficient Min-Sum Decoder Design for High-Rate QC-LDPC Codes in Magnetic Recording," 2007.

* cited by examiner

SEQUENTIAL POWER TRANSITIONING OF MULTIPLE DATA DECODERS

SUMMARY

Various embodiments disclosed herein are generally directed to managing decoder circuits in a data storage device, such as low density parity check (LDPC) decoders in a solid state drive (SSD).

In some embodiments, a non-volatile memory (NVM) is configured to store data in the form of code words. Each code word has a user data payload and associated code bits. A plurality of data decoder circuits are configured to use the code bits to detect and correct bit errors in the code words during a read operation. A power sequence circuit is configured to successively transition each of the data decoder circuits from a first power mode to a second power in turn during a power transition sequence in accordance with a time varying profile in which each data decoder circuit is deactivated at a different time and at a conclusion of a predetermined time interval. In this way, voltage spikes or other anomalous conditions on a voltage source pathway may be reduced.

These and other features and advantages which may characterize various embodiments can be understood in view of the following detailed discussion and the accompanying drawings.

DETAILED DESCRIPTION

Figure 1:
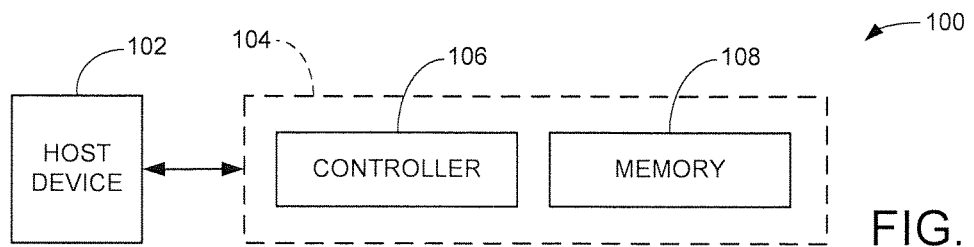
FIG. 1 provides a functional block representation of a data processing system to provide an exemplary operational environment for various embodiments of the present disclosure.

The present disclosure generally relates to the management of decoding circuitry in a data storage device, such as but not limited to low density parity check (LDPC) decoders in a solid state drive (SSD).

LDPC codes are linear error correcting block codes that are useful in the transfer of data. LDPC codes take the form of code words having both an informational component (e.g., user data bits) and an overhead or redundant component (e.g., code bits) for error correction. A common convention is to describe LDPC code words as k/n codes, where n represents the total number of bits, k represents the number of user bits, and n-k represents the number of code bits. An LDPC code rate may be defined as the ratio of code bits to total bits in a code word (e.g., (n-k)/n).

An LDPC decoder is a type of circuit used to decode LDPC codes. An LDPC decoder often employs a number of variable node units (VNUs) and check mode units (CNUs). The VNUs generate individual code bit reliabilities. The CNUs perform parity checks upon different combinations of the contents of the VNUs using combinatorial logic functions and generate additional information that is stored in the memory and used by the VNUs in subsequent processing.

An input code word is successfully decoded if all the parity constraints of the CNUs are met. If one or more errors are detected, subsequent iterations are carried out, including through the use of soft information that gives further information regarding the state of code word. Each iteration involves messages being sent between the various units. Depending on the notation that is used, messages from the VNUs to the CNUs may be referred to as v2c, r or P messages, and messages from the CNUs to the VNUs may be referred to as c2v, q or Q messages.

Modern data storage devices such as solid state drives (SSDs) can utilize multiple parallel data channels to concurrently process data stored on multiple non-volatile memory (NVM) devices, such as flash dies in a flash memory module. One or more LDPC decoders can be provided in flash management electronics for each channel to decode, in parallel, data streams obtained from each flash die as required.

The use of multiple LDPC decoders can significantly enhance the data throughput capabilities of an SSD. However, the use of multiple LDPC decoders can also adversely impact the operational stability of other circuitry in the SSD. Depending on the complexity of the encoding scheme, LDPC decoders can consume a significant amount of electrical power during operation, and the duration of time that each LDPC decoder operates to process the input code words can vary significantly from one code word to the next.

During SSD operation, there will likely be times when an LDPC decoder is operational to decode read data, and other times when the LDPC decoder is in an idle state once a given decode operation has been completed and the decoder is waiting for the next set of input read data. Should multiple LDPC decoders change state at or near the same time, such as by a group of the decoders powering down (e.g., transitioning to idle or off), deleterious effects can be induced in the system, including voltage spikes or other anomalous power conditions that may adversely affect other circuitry of the device. Similarly, bringing multiple LDPC decoders online to the active state at or near the same time may present significant current draw or other adverse effects upon the other circuitry of the device.

Accordingly, various embodiments of the present disclosure are directed to an apparatus and method for managing decoder circuitry in a data storage device, such as but not limited to an SSD.

In some embodiments, the data storage device has a controller circuit which directs writing of data in the form of code words to a non-volatile memory (NVM). Each code word has a user data payload and associated code bits. A plurality of decoder circuits are configured to use the code bits to detect and correct errors in the code words.

A power sequence circuit arbitrates among the various decoder circuits to successively transition each of the decoder circuits in turn from a first power mode (state) to a second power mode (state) at a different time. It is contemplated that the first power state will be a higher powered state, such as a normal, fully powered state, and the second power state will be a lower powered state such as a standby, idle state. In this way, the transition results in a significant reduction in the amount of electrical power consumed by the associated decoder. Such is not necessarily limiting, however; in other embodiments, the first power state may be a lower powered state and the second power state may be a higher powered state.

Each decoder circuit continues to operate at the first powered state until the decoder circuit is deactivated. If the decoder circuit has successfully completed the decoding operation upon a given set of input data, the decoder circuit continues to perform decoding operations, either upon the existing node values or upon new dummy data supplied to the decoder. A timer circuit may be used to provide an intervening delay time from the deactivation of one decoder circuit to the next.

In some embodiments, the NVM is characterized as a flash memory having a plurality of flash dies. The decoders are characterized as LDPC (low density parity check) decoders, with at least one LDPC decoder provided for each flash die. The LDPC decoders may be incorporated into a number of flash media electronics (FME) circuits, each responsible for managing an associated flash die. The FME circuits may be arranged in a master/slave arrangement to arbitrate the power down sequence order using a request queue and a grant processor circuit.

In this way, the various decoder circuits are transitioned among the different power states in a controlled sequential fashion, reducing the generation of voltage spikes or other anomalous power events that may adversely affect remaining aspects of the data storage device as the decoder circuits transition to the second state.

These and other features and advantages of various embodiments can be understood beginning with a review of FIG. 1 which shows a data processing system 100 having a host device 102 and a data storage device 104. The data storage device 104 has a controller circuit 106 and a memory module 108.

The controller block 106 represents a hardware based and/or programmable processor based circuit configured to provide top level communication and control functions. The memory module 108 includes solid state non-volatile memory (NVM) for the storage of user data from the host device.

Figure 2:
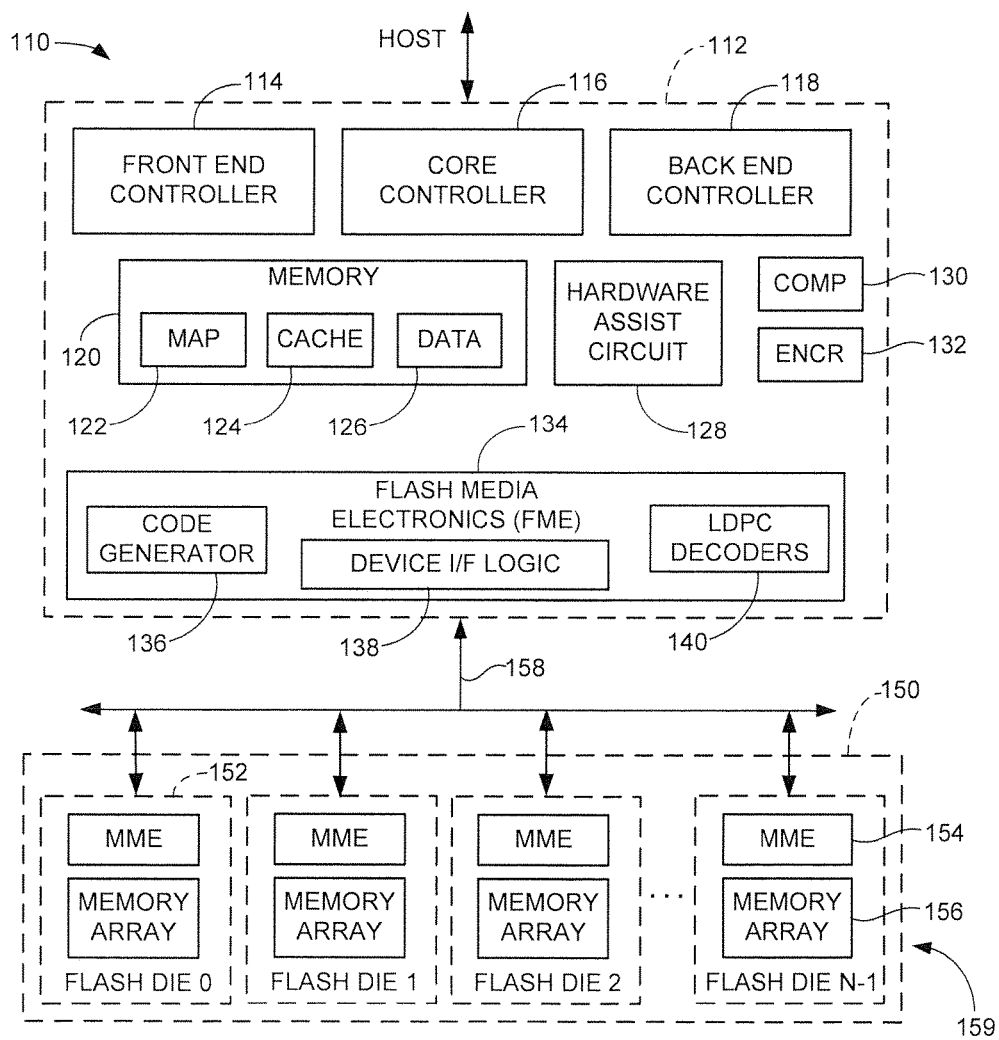
FIG. 2 is a functional block representation of the data storage device of FIG. 1 characterized as a solid state drive (SSD) in accordance with some embodiments.

FIG. 2 shows a data storage device 110 generally corresponding to the device 104 in FIG. 1. The device 110 is configured as a solid state drive (SSD) that communicates with the host device via one or more Peripheral Component Interface Express (PCIe) ports, although other configurations can be used. The NVM is contemplated as comprising NAND flash memory, although other forms of solid state non-volatile memory can be used.

The SSD 110 includes a controller circuit 112 with a front end controller 114, a core controller 116 and a back end controller 118. The front end controller 114 performs host I/F functions, the back end controller 118 directs data transfers with the memory module 114 and the core controller 116 provides top level control for the device.

Each controller 114, 116 and 118 includes a separate programmable processor with associated programming (e.g., firmware, FW) in a suitable memory location, as well as various hardware elements to execute data management and transfer functions. This is merely illustrative of one embodiment; in other embodiments, a single programmable processor (or less/more than three programmable processors) can be configured to carry out each of the front end, core and back end processes using associated FW in a suitable memory location. A pure hardware based controller configuration can also be used. The various controllers may be integrated into a single system on chip (SOC) integrated circuit device, or may be distributed among various discrete devices as required.

A controller memory 120 represents various forms of volatile and/or non-volatile memory (e.g., SRAM, DDR DRAM, flash, etc.) utilized as local memory by the controller 112. Various data structures and data sets may be stored by the memory including one or more map structures 122, one or more caches 124 for map data and other control information, and one or more data buffers 126 for the temporary storage of host (user) data during data transfers.

A non-processor based hardware assist circuit 128 may enable the offloading of certain memory management tasks by one or more of the controllers as required. The hardware circuit 128 does not utilize a programmable processor, but instead uses various forms of hardwired logic circuitry such as application specific integrated circuits (ASICs), gate logic circuits, field programmable gate arrays (FPGAs), etc.

Additional functional blocks can be realized in hardware and/or firmware in the controller 112, such as a data compression block 130 and an encryption block 132. The data compression block 130 applies lossless data compression to input data sets during write operations, and subsequently provides data de-compression during read operations. The encryption block 132 provides any number of cryptographic functions to input data including encryption, hashes, decompression, etc.

Flash media electronics (FME) circuitry 134 supports back end processing operations and may include a code generator circuit 136, a device I/F logic circuit 138 and one or more low density parity check (LDPC) decoder circuits 140. The code generator circuit 136 generally operates to generate inner codes and outer codes for error detection and correction purposes.

As explained below, the inner codes include LDPC codes that are appended to the written data. The outer codes are multi-page parity values to enable data recovery in the event of a block failure or other condition that results in an unrecoverable error using the LDPC inner codes. The device I/F logic circuit 138 provides interface control with the NVM. The LDPC circuits 140 provide LDPC decoding during subsequent read operations.

A memory module 150 corresponds to the memory 108 in FIG. 1 and includes a plural number N flash dies 152 (denoted as dies 0 to N−1). Each flash die 152 includes a memory module electronics (MME) circuit which is a rudimentary processor circuit that directs data accesses to an associated flash memory array 156. The device I/F logic communicates with the MME circuits 154 via one or more data busses 158 to support parallel data transfer operations with the respective dies 152. The storage space provided by the respective flash memory arrays provides an overall flash memory or flash memory space 159. Data are written to the respective data arrays in the form of pages, which represent the smallest increment of data that can be written or read at a time.

Figure 3:
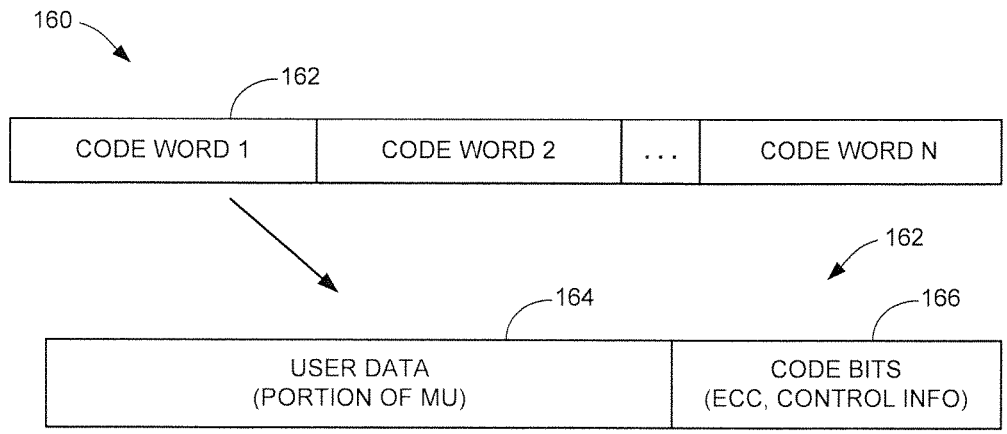
FIG. 3 shows an arrangement of code words written to the flash memory of FIG. 2.

FIG. 3 shows an arrangement of data 160 written to a selected page as an integer number of code words 162 of selected length. Each code word 162 includes a user data portion 164 and a code bit portion 166. The user data portion stores bits from one or more user data blocks supplied by the host device 102 (FIG. 10). The code bit portion stores the LDPC code bits as well as other control information associated with the user data bits. In the present embodiment, it will be understood that the code bits in the code bit portion 166 are written as inner code bits at a selected inner code rate to provide at least a desired BER for the user data bits in portion 164.

Figure 4:
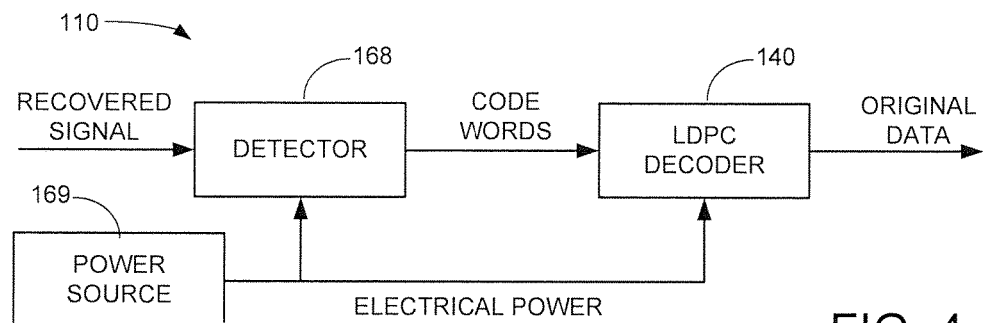
FIG. 4 shows a data recovery channel of the SSD that uses a low density parity check (LDPC) decoder to decode the code words of FIG. 2.

FIG. 4 shows further aspects of the SSD 110 of FIG. 2 in some embodiments. A detector circuit 168, which may form a portion of a selected MME circuit 154 and/or a portion of the FME circuitry 134, operates upon a recovered signal representing the sensed bit values of a selected set of the associated flash memory array 156, such as one or more pages of data. Processing steps by or prior to the detector 168 can take a variety of forms, including an analog front end, digitalization, maximum likelihood detection, etc.

The detector 164 outputs a sequence of code bits and bit reliabilities, e.g., log-likelihood (LLR) values, based on one or more reads from the storage media. Each code word has an informational component and a redundant (overhead) component and consists of a number of bits (e.g., m bits). Code words of any suitable length can be used based on the architecture of the system. Code words having thousands of bits or more (m>>1000) are commonly employed in many data storage device applications.

The LDPC decoder 140 applies a min-sum LDPC algorithm to the input code hit reliabilities to output the original data (e.g., the informational content of the recovered signal). Multiple iterations and the use of read retries and soft information may be employed to recover the original data for further processing.

Electrical power utilized by the detector 164 and the LDPC decoder 140 (as well as other circuits of the SSD 110) is supplied by a power source 164. The power source may be incorporated into the SSD or may represent conditioning and regulation circuitry that receives input power from the host device 102 or other source. Other input control signals may be supplied to the circuits 140, 168, such as clock signals, gate signals, etc.

Figure 5:
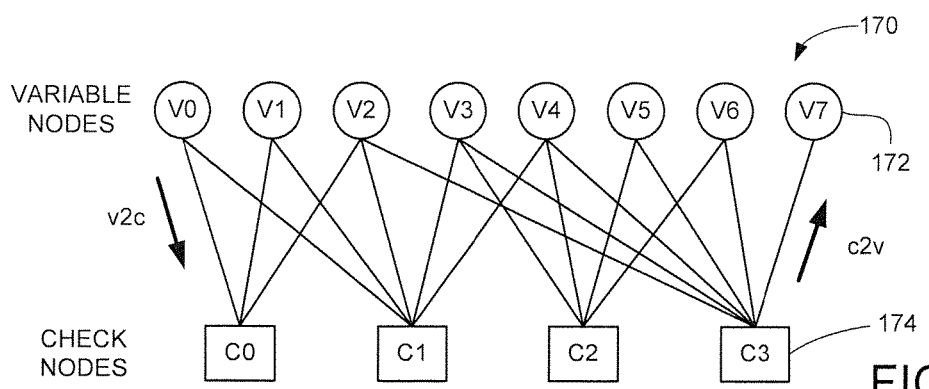
FIG. 5 is an interconnection diagram illustrating aspects of the LDPC decoder.

FIG. 5 provides a Tanner diagram 170 to illustrate aspects of the LDPC decoder 140 in some embodiments. The decoder includes a number of variable node units (VNUs) 172, also referred to as variable nodes. A total of eight (8) variable nodes 172 are shown in FIG. 5, labeled as V0-V7, although in practice each LDPC decoder 140 will tend to have many more such nodes.

The variable nodes 172 communicate with a series of check node units (CNUs) or check nodes 174. A total of four check nodes are shown, labeled as C0-C3 although, as before, many more check nodes will be provided as required.

Input code bit values are loaded to the variable nodes 172, with a single bit log-likelihood ratio (LLR) supplied in each variable node. The bit LLR values in the variable nodes are selectively combined to form v2c messages that are transferred to the corresponding check nodes 174. In FIG. 5, check node C0 receives bits from variable nodes V0, V1 and V1 check node C3 receives bits from variable nodes V2 through V7, and so on.

Once received, the v2c messages are evaluated by the check nodes using certain parity constraints to resolve the code word. In one example, the check nodes 174 may implement an even parity constraint so that all of the bits in a given v2c message should sum up to a 0 (even) value. Other parity constraints can be used.

Messages with these parity computational results are returned in the form of c2v messages. Generally, each iteration of the LDPC algorithm includes the generation and transfer of one set of v2c messages to the check nodes, followed by the return of one set of c2v messages to the variable nodes. If no errors are present, the resulting code word is resolved and the data are output as shown in FIG. 4. If at least one error is present, the values of the variable nodes 172 are updated using the c2v messages and, in some cases, other information. Subsequent iterations may be applied in an effort to resolve the code word.

It follows that the resolution of each code word by the LDPC decoders 140 can be computationally intensive, as well as consume significant amounts of electrical power. Such considerations are enhanced with greater levels of complexity in the SSD 110, such as larger numbers of flash dies (e.g., N=16, 32, etc.) as well as the use of one or multiple LDPC decoders per die channel.

The LDPC decoders 140 have multiple power modes. Active (e.g., "full power") mode describes a state when the LDPC decoder is processing a solution upon input data presented to the decoder. Idle (e.g., "inactive," "standby," or "powered down") mode describes a state when the LDPC decoder is not currently processing a solution, but is still operationally ready to process such data. The MK may still receive power and control signal inputs such as clock signals during idle mode, but will consume significantly less power as compared to active mode. Yet another power mode is described as a deactivated (e.g., "powered off") mode, where all operational power, clocks and other inputs have been removed from the decoder.

Figure 6:
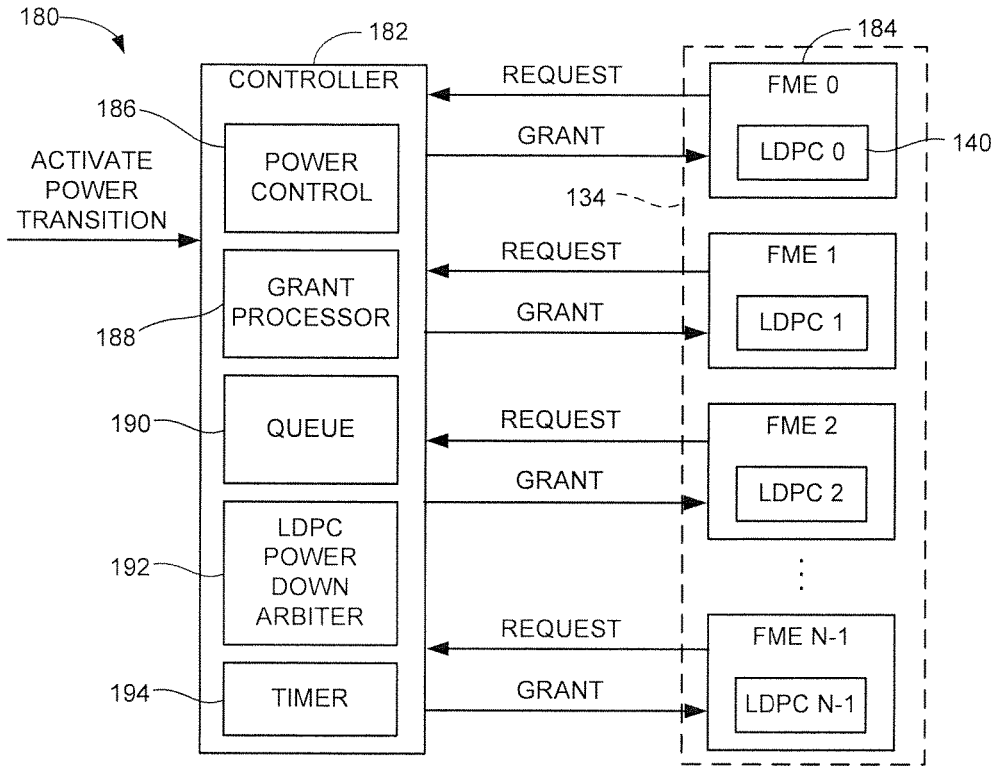
FIG. 6 shows a decoder arbitration circuit used in accordance with some embodiments to transition a number of LDPC decoders of the SSD among different power states.

FIG. 6 provides a functional block representation of a decoder arbitration circuit 180 that operates in accordance with various embodiments to provide arbitrated power transitioning for each of the LDPC decoders 140 in the SSD 110 among different power modes. This reduces the generation of voltage spikes and other anomalous electrical power conditions for the SSD.

The circuit 180 includes a controller circuit 182 and a plurality of FME circuit modules 184. The controller circuit 182 forms a portion of the SSD controller 112, such as but not limited to the back end controller 116, and may be realized in hardware and/or firmware. The controller circuit 182 includes a number of circuits including a power control circuit 186, a grant processor 188, a request queue 190 an LDPC power down arbiter circuit 192 and a timer circuit 194.

The FME circuit modules 184 form a portion of the FME circuitry 134 discussed above in FIG. 2. Each FME circuit module 184 is shown to include a single associated LDPC decoder circuit 140, although multiple LDPC decoders may be provided for each module. While separate communications to the FMEs are shown, in at least some embodiments the FME circuit modules 184 may be arranged in a master/slave arrangement with one of the modules acting as the main module and forwarding control signals to the remaining modules. Other arrangements can be used.

The controller 182 may be configured to initiate an LDPC power transitioning sequence, or mode of operation, responsive to an input signal from other aspects of the SSD 110. In other cases, the controller 182 may be configured to continuously enact the arbitration mode during normal SSD operation.

The present discussion will consider a case in which the controller 182 controls the transitioning of the LDPC decoders 140 s from active mode to idle mode, but allows the LDPC decoders 140 to automatically transition from idle mode to active mode as needed. In this scheme, during normal device operation the SSD 110 operates to service various host access commands, among which will include read commands. As discussed above, this will result in the issuance of one or more read commands to retrieve one or more pages of data from the flash memory 159. The retrieved data will be presented to the associated LDPC decoders 140 as code words 162. The LDPC decoders 140 commence decoding operations on the presented data. If a given LDPC decoder is in an idle mode, the decoder will transition to the active mode in order to carry out this processing.

At such time that each LDPC decoder 140 successfully completes a decoding operation, the successfully decoded data are transferred upstream for further processing as described above (see FIG. 2). At this point it will be noted that the LDPC decoders may be configured to perform up to a predetermined maximum number of iterations in an effort to decode the data. In some cases, this predetermined maximum number of iterations may be reached while one or more bit errors may still be present in the code word (e.g., unsuccessful decoding). In each of these cases (e.g., either successful decoding or maximum iterations reached), a conventional LDPC decoder may be configured to power down to a reduced power mode, such as by transitioning from active mode to idle mode.

Instead, a request is generated at this point and output by the associated FME 184 to the controller 182 to request the LDPC decoder 140 be allowed to undergo a power mode transition. In this case, each of the requests represented in FIG. 6 represent a power down request to permit the associated decoder to transition from active mode to idle mode. Until such time that permission is granted, the decoder remains in active mode even though a solution has already been found (or the maximum number of iterations have been made).

The power down requests will be received at different, variable times based on the SSD workload and the rate at which the various decoders complete the associated decoding operations. The requests are accumulated in the queue 190 in the order received, or some other order.

The grant processor 188 operates to grant permissions to the respective FME circuit modules 184 in response to the requests. The grants may take the form of stop enable (stop en) signals so that, when received, the associated LDPC decoder 140 transitions from active to idle mode.

In some cases, each decoder continues to operate upon the existing states of the variable nodes 172 that led to the successful decoding operation. In other cases, the FME 184 may alter the contents of one or more of the variable nodes, or introduce new dummy data to all of the nodes, in order to cause the decoder 140 to continue to process solutions. Once the grant is received, the nodes 172, 174 are cleared and the decoder 140 powers down to idle mode.

Any output(s) of the decoder generated during the time between request and grant will normally be discarded once the grant has been received. One exception may be if the LDPC decoder is able to successfully obtain a decoded result while waiting for the grant, in which case the successfully decoded data may be forwarded upstream. Since the LDPC decoders are maintained in decoding mode after the request has been made, and if the LDPC decoders are allowed to continue attempting a solution, it is contemplated that some percentage of successful decodes may thus arise, leading to enhanced readback performance.

The grant processor 188 manages the timing of the grants in such a way as to reduce the transitioning of the decoders to the power down state at the same time. In some cases, the timer 194 is used to provide a minimum allowable amount of time between power down grant requests. In other cases, up to a selected maximum number of LDPC decoders may be allowed to power down within a particular timing window. Some number of requests up to a predetermined threshold may be immediately granted, after which timed arbitration is enacted for subsequent requests. The requests may be granted in a different order than that received to balance the transitioning among different dies or other portions of the memory module.

Figure 7:
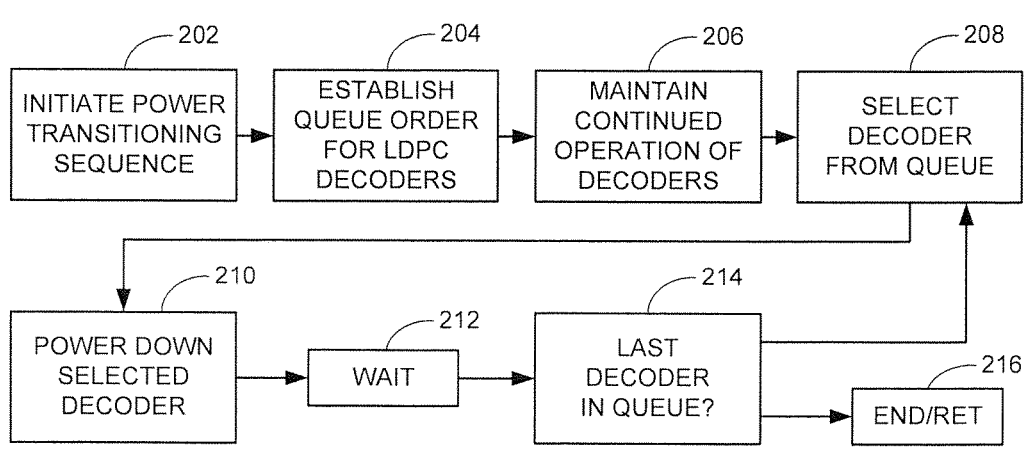
FIG. 7 is a flow diagram illustrating a power transition sequence carried out by the circuitry of FIG. 6.

FIG. 7 provides a flow diagram 200 to illustrate the operation of the circuit 180 of FIG. 6 in accordance with the foregoing discussion. A power transitioning sequence is initiated at block 202 responsive to receipt of the activation signal. A queue order for the LDPC decoders is established at block 204 to provide the sequence in which the decoders will be deactivated in turn. Continued operation of the decoders is indicated at block 206 as discussed above, since concurrent deactivation is specifically avoided by the circuit 180.

A first LDPC decoder 140 is selected from the queue 192 at block 208, and the grant processor 188 grants permission to the selected LDPC decoder to transition from an active state to a deactivated state at block 210. Block 212 denotes a wait interval as a selected period of time that may be enacted using the timer 194. At the conclusion of the time interval, block 214 determines whether the selected LDPC decoder is the last decoder in the queue; if not, the next decoder is selected at block 208 and the foregoing process is repeated until the queue is emptied, at which point the processing ends at 216. It will be appreciated that during normal operation, it is contemplated that the queue may be repetitively filled, emptied and refilled as required, and the grant processor 188 will operate accordingly to service the queued requests.

The system can be readily modified to handle other forms of power mode transitions. For example, to reduce current draw, voltage drop or other adverse situations, the controller 182 can additionally or alternatively be configured to arbitrate requests to transition the respective LDPC decoders 140 from a lower power mode, such as the idle mode, to a higher power mode, such as the active mode. The processing could be configured similarly; power up requests could be issued and granted in an arbitrated fashion. This may undesirably reduce the throughput of the SSD 110 since the LDPC decoders would be delayed in transitioning to active mode, but could have applicability in low power or other controlled environments where power management should be enhanced at the potential expense of data throughput performance. In some highly controlled environments, both the transition from active to idle and the transition from idle to active may be managed to precisely control the operation of the individual decoders.

In still another embodiment, the circuit 182 in FIG. 6 may operate during a power down sequence for the SSD, in which the LDPC decoders are transitioned to the deactivated mode during a larger shut down sequence for the entire SSD (or a portion thereof). SSDs may have a limited amount of available power stored on a local device, such as a battery, capacitor, etc., and it may be advantageous to control the powering down of the various LDPC decoders 140 so as to not adversely affect this limited amount of power which may be used by the SSD to store critical data tables, perform data clean operations, etc. in anticipation of the deactivated state. The LDPC shutdown sequence may be used to remove clock signals, power, data etc. from the decoders, such as but not limited to the case where the LDPC decoders are on a separate power island.

In this case, the activation signal may be issued by the power control circuit 186 and, in response thereto, the circuit 182 initiates a deactivation sequence. It is contemplated that at least some or all of the respective LDPC decoders 140 may be actively generating messages and decoding data at the time of receipt of the power down signal, although such is not necessarily required. If so, the LDPC decoders 140 may be instructed to continue such processing until individually powered down, even if such processing involves continued operation upon the existing state of the various nodes.

As before, part of the shutdown sequence may involve loading one or more code words to the respective decoders to initially place each LDPC decoder in a baseline active state, thereby providing a more uniform power down sequence. The loaded code words may be dummy data (e.g., certain reads of data not requested for use by the SSD or host) so that any output values will be discarded rather than used as during normal operation.

It is contemplated that the same predetermined time interval will be used between successive decoder deactivations, although such is not necessarily required; as the total load consumed by the group of LDPC decoders is reduced, there is generally a reduced likelihood that the powering down of the remaining decoders will induce voltage spikes or other anomalous events on the voltage source pathways. Hence, different time varying profiles may be used by the circuit 180 as required.

Figure 8:
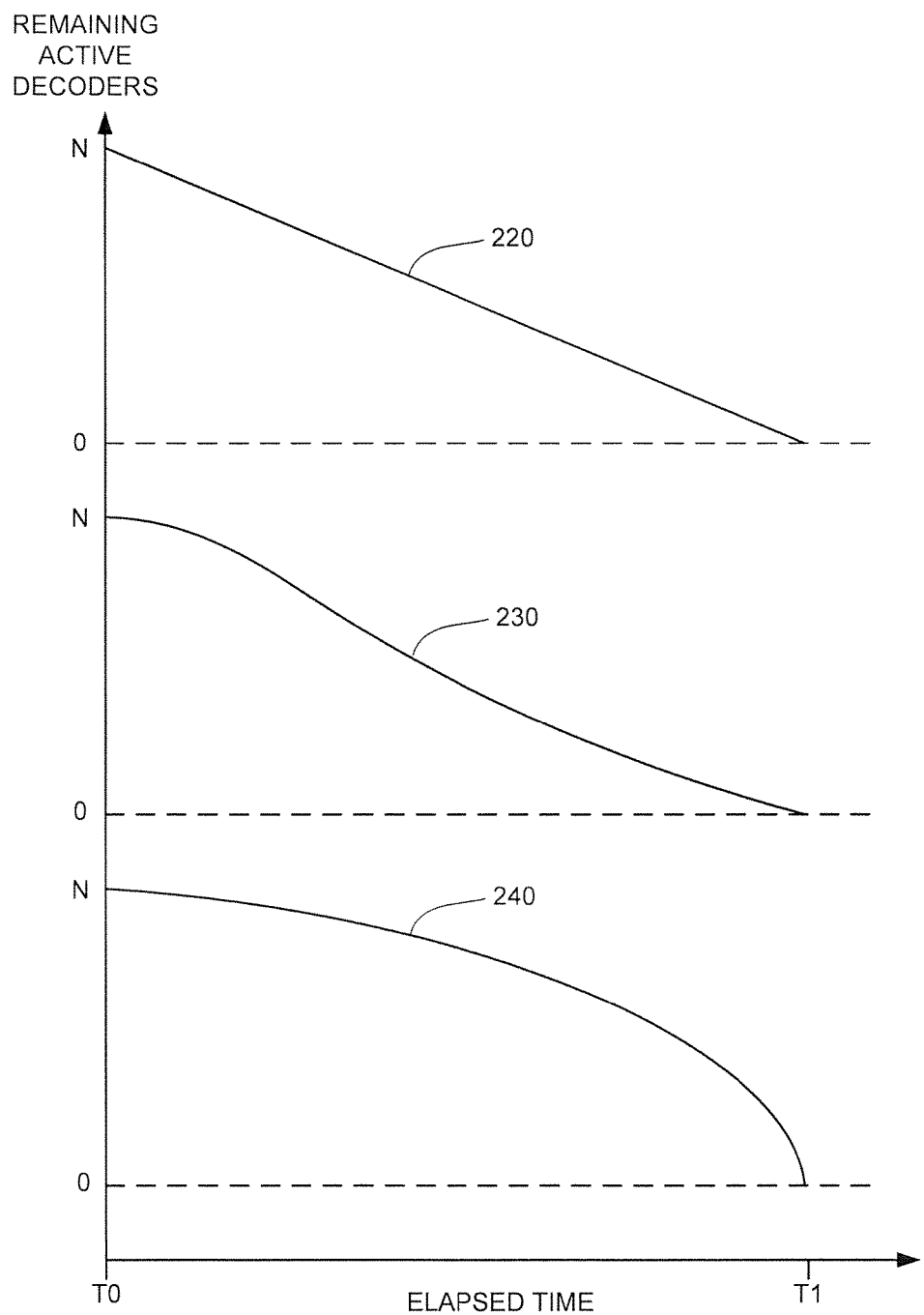
FIG. 8 provides a graphical representation of different time-varying profiles that may be used to sequence the LDPC decoders of FIG. 6.

FIG. 8 shows graphical representations of three such profiles plotted against an elapsed time x-axis and a common y-axis. A first profile curve 220 represents the transition of the N LDPC decoders to a deactivated state using a linear process in which the delay between each pair of successively deactivated decoders is nominally constant. Stated another way, curve 220 involves re-initializing the timer circuit 194 to count out the same elapsed period of time between each successive pair of deinitializations.

A second profile curve 230 uses successively longer delays so the rate at which the decoders are deactivated increases over the power down sequence interval. Curve 230 can be realized by re-initializing the timer circuit 194 to provide successively longer elapsed periods of time. A third profile curve 240 shows successively longer delays so that the rate of deactivation decreases over time (e.g., shorter successive periods of time from the timer circuit 194). These and other variations can be implemented as required, including adaptively by monitoring the voltage line or other parameters during previous power down sequences.

Because the LDPC decoders are generally needed in order to decode the various code words written to the flash memory 159, it will be appreciated that the LDPC decoders are not deactivated by the circuit 180 until such time that no more data reads are required by the SSD to effect the SSD deactivation sequence.

A top level controller, such as the core controller 116, may monitor the overall SSD deactivation and determine when it is now appropriate to begin shutting down the LDPC decoders (as well as other aspects of the controller/flash dies, etc.), at which point the controller 182 receives the power down signal or other indication. It is contemplated that the circuit 180 will proceed accordingly; however, if time is of the essence the top level controller may further specify the available time left during which the respective LDPC decoders need to be shut down (e.g., the interval from time T0 to T1 in FIG. 8). These and other considerations will readily occur to the skilled artisan in view of the present disclosure. The SSD shutdown sequence may be directed to a standby mode for the SSD, as well as an initialization operation to transition to normal operation While various embodiments disclosed herein have been directed to the environment of an SSD that uses NAND flash memory, such is not necessarily required. Similarly, while LDPC decoders have been exemplified as particularly suitable forms of data decoders to which the various embodiments may be directed, other forms of data decoding circuitry may be used as well.

It is to be understood that even though numerous characteristics and advantages of various embodiments of the present disclosure have been set forth in the foregoing description, together with details of the structure and function of various thereof, this detailed description is illustrative only, and changes may be made in detail, especially in matters of structure and arrangements of parts within the principles of the present disclosure to the full extent indicated by the broad general meaning of the terms in which the appended claims are expressed.

What is claimed is:

1. An apparatus comprising:
   a non-volatile memory (NVM) configured to store data in the form of code words, each code word comprising a user data payload and associated code bits;
   a plurality of data decoder circuits each configured to use the code bits to detect and correct bit errors in the code words during a read operation; and
   a power transition circuit configured to transition each of the data decoder circuits from a first power mode to a different, second power mode in accordance with a time varying profile in which each data decoder circuit is transitioned at a different time and at a conclusion of a predetermined time interval.

2. The apparatus of claim 1, wherein the first power mode is an active power mode in which each of the data decoder circuits consumes a first amount of power, and wherein the second power mode is an idle power mode in which each of the data decoder circuits consumes a lower, second amount of power.

3. The apparatus of claim 1, wherein each of the data decoder circuits is configured to issue a power down request to the power transition circuit responsive to a successful decoding operation in which no bit errors remain in an associated code word or responsive to a maximum number of iterations being performed by the data decoder circuit with at least one bit error remaining in the associated code word, and wherein the power transition circuit issues grant values at different times to the respective data decoder circuits responsive to the power down requests.

4. The apparatus of claim 3, wherein each of the data decoder circuits operates in the first power mode during the decoding operation and remains in the first power mode until receipt of the associated grant value, after which the associated data decoder circuit transitions to the second power mode.

5. The apparatus of claim 4, wherein the power transition circuit issues a first grant value to a first data decoder circuit at a first time responsive to a first power down request from the first data decoder circuit and issues a second grant value to a second data decoder circuit at a different, second time responsive to a second power down request from the second data decoder.

6. The apparatus of claim 1, further comprising a timer circuit configured to be initialized by the power transition circuit responsive to the transition of a first selected data decoder circuit from the first power mode to the second power mode, wherein once initialized the timer circuit denotes an elapsed period of time corresponding to the predetermined time interval, and wherein at a conclusion of the elapsed period of time the power transition circuit transitions a second selected data decoder circuit from the first power mode to the second power mode.

7. The apparatus of claim 6, wherein the power transition circuit is further configured to reinitialize the timer circuit at the transition of each of the data decoder circuits so that the timer circuit provides an elapsed period of time responsive to each transition of each data decoder circuit in the sequence.

8. The apparatus of claim 7, wherein the elapsed period of time is the same each time the timer circuit is initialized by the power transition circuit.

9. The apparatus of claim 7, wherein the timer circuit provides different amounts of elapsed periods of time between successive transitions of the data decoder circuits.

10. The apparatus of claim 1, wherein the power transition circuit comprises a queue that stores power transition requests associated with each of the data decoder circuits, and an arbiter circuit which selects the order in which the data decoder circuits are transitioned responsive to the queue.

11. The apparatus of claim 1, wherein each data decoder circuit outputs a power transition request to the power transition circuit responsive to a successful decoding of a code word, and continues to perform data decoding operations while remaining in the first power mode until a grant signal is provided from the power transition circuit.

12. The apparatus of claim 1, wherein the data decoder circuits are LDPC (low density parity check) decoders each comprising a plurality of variable nodes configured to generate code bit values and a plurality of check nodes configured to perform parity check operations upon messages formed from the code bit values.

13. The apparatus of claim 12, wherein the power transition circuit further configures each of the LDPC decoders to continue to process the code bit values stored in the variable nodes pending transition to the second power mode.

14. The apparatus of claim 12, wherein each of the LDPC decoders processes dummy code words loaded to the variable nodes until the respective LDPC decoders are transitioned to the second power mode.

15. The apparatus of claim 1, characterized as a solid state drive, the NVM comprising NAND flash memory arranged across a plurality of flash dies, wherein at least one of the plurality of data decoder circuits is configured to decode code words from an associated one of the flash dies.

16. A method comprising:
storing code words to a non-volatile memory (NVM) each having a user data payload and associated code bits;
reading the code words using a plurality of data decoder circuits configured to use the code bits to detect and correct bit errors in the code words; and
deactivating the data decoder circuits in turn during a power down sequence in accordance with a time varying profile by deactivating each of the data decoder circuits at a conclusion of an intervening time interval between successive deactivations to reduce a generation of anomalous power conditions with a voltage source associated with the NVM.

17. The method of claim 16, further comprising:
initializing a timer circuit to denote a first elapsed period of time;
deactivating a first selected data decoder circuit at a conclusion of the first elapsed period of time;
re-initializing the tinier circuit responsive to the deactivating of the first selected data decoder circuit to denote a second elapsed period of time; and
deactivating a second selected data decoder circuit at a conclusion of the second elapsed period of time.

18. The method of claim 17, wherein each of the data decoder circuits is configured to issue a power down request to a power transition circuit responsive to a successful decoding operation in which no bit errors remain in an associated code word or responsive to a maximum number of iterations being performed by the data decoder circuit with at least one bit error remaining in the associated code word, and wherein the power transition circuit issues grant values at different times to the respective data decoder circuits responsive to the power down requests.

19. The method of claim 16, wherein the data decoder circuits are LDPC (low density parity check) decoders each comprising a plurality of variable nodes configured to generate code bit values and a plurality of check nodes configured to perform parity check operations upon messages formed from the code bit values.

20. The method of claim 19, further comprising configuring each of the LDPC decoders to continue to process the code bit values stored in the variable nodes pending the deactivation of the LDPC decoders.

* * * * *

UNITED STATES PATENT AND TRADEMARK OFFICE
CERTIFICATE OF CORRECTION

| | | |
|---|---|---|
| PATENT NO. | : 10,171,110 B1 | Page 1 of 1 |
| APPLICATION NO. | : 15/640724 | |
| DATED | : January 1, 2019 | |
| INVENTOR(S) | : Jeffrey John Pream and Eric Michael Beck | |

It is certified that error appears in the above-identified patent and that said Letters Patent is hereby corrected as shown below:

In the Claims

Column 12, Line 19:
"the tinier circuit" should be "the timer circuit"

Signed and Sealed this
Twelfth Day of February, 2019

Andrei Iancu
*Director of the United States Patent and Trademark Office*